United States Patent
Rouh et al.

(10) Patent No.: US 7,554,106 B2
(45) Date of Patent: *Jun. 30, 2009

(54) PARTIAL ION IMPLANTATION APPARATUS AND METHOD USING BUNDLED BEAM

(75) Inventors: Kyoung Bong Rouh, Gyeonggi-do (KR); Seung Woo Jin, Gyeonggi-do (KR); Min Yong Lee, Seoul (KR); Yong Soo Jung, Seoul (KR)

(73) Assignee: Hynix Semiconductor Inc., Icheon-shi (KR)

( * ) Notice: Subject to any disclaimer, the term of this patent is extended or adjusted under 35 U.S.C. 154(b) by 397 days.

This patent is subject to a terminal disclaimer.

(21) Appl. No.: 11/445,643

(22) Filed: Jun. 1, 2006

(65) Prior Publication Data

US 2008/0128640 A1  Jun. 5, 2008

(30) Foreign Application Priority Data

Apr. 28, 2006  (KR) .................... 10-2006-0038520

(51) Int. Cl.
*G21K 5/10* (2006.01)
*H01J 37/08* (2006.01)

(52) U.S. Cl. .............. 250/492.21; 250/492.2; 250/396 R; 250/423 R; 250/398; 315/505; 315/5.41; 313/359.1

(58) Field of Classification Search .......... 250/492.21, 250/396 R, 398, 423 R, 492.2; 313/359.1; 315/505, 5.41

See application file for complete search history.

(56) References Cited

U.S. PATENT DOCUMENTS

| 6,208,095 | B1 | 3/2001 | DiVergilio et al. |
| 6,242,747 | B1 | 6/2001 | Sugitani et al. |
| 6,583,429 | B2 | 6/2003 | Saadatmand et al. |
| 6,635,890 | B2 | 10/2003 | Saadatmand et al. |
| 6,653,643 | B2 | 11/2003 | Saadatmand et al. |
| 2008/0128639 | A1* | 6/2008 | Rouh et al. ............ 250/492.21 |

FOREIGN PATENT DOCUMENTS

| KR | 1020000015861 A | 3/2000 |
| KR | 1020020045537 A | 6/2002 |
| KR | 1020050074309 A | 7/2005 |
| WO | WO 02/054443 A2 | 7/2002 |

* cited by examiner

*Primary Examiner*—Jack I Berman
*Assistant Examiner*—Meenakshi Sahu
(74) *Attorney, Agent, or Firm*—Townsend and Townsend and Crew LLP

(57) ABSTRACT

An ion implantation apparatus comprises an ion beam source for generating an initial ion beam, a bundled ion beam generator adapted to change the initial ion beam into a bundled ion beam based on a predetermined frequency to pass the bundled ion beam for a first time while passing the initial ion beam for a second time, a beam line for accelerating the ion beam having passed through the ion beam generator, and an end station for arranging a wafer therein to allow the ion beam accelerated by the beam line to be implanted in the wafer, the end station operating to move the wafer in a direction perpendicular to an ion beam implantation direction, so as to implant the bundled ion beam in a first region of the wafer and the initial ion beam in a second region of the wafer.

15 Claims, 6 Drawing Sheets

PARTIAL ION IMPLANTATION APPARATUS AND METHOD USING BUNDLED BEAM

BACKGROUND OF THE INVENTION

1. Field of the Invention

The present invention relates to an ion implantation apparatus and method, and more particularly, to a partial ion implantation apparatus and method using a bundled beam.

2. Description of the Related Art

In general, semiconductor devices, more particularly, semiconductor memory devices such as dynamic random access memories (DRAMs), are manufactured via a great number of unit processes. The unit processes include a lamination process, etching process, ion implantation process, etc. Conventionally, the unit processes are performed for each wafer. Of the above mentioned unit processes, an ion implantation process is a process technique for accelerating dopant ions such as boron and arsenic using a strong electric field, so as to allow the dopant ions to pass through the surface of a wafer. Implantation of such ions is able to change the electrical properties of materials.

When performing the ion implantation process for a wafer, generally, ion beams are scanned in an X-direction while moving the wafer in a Y-direction, so as to implant ions into the wafer. In the implementation of the ion implantation process, it is conventional that approximately the same dose of ions is implanted over the entire region of the wafer. This ion implantation manner is efficient for the ion implantation process itself, but may be undesirable in consideration of other unit processes. That is, where other several unit processes are sequentially performed, the process results, such as the thickness of a laminated film and etching degree, may be irregular over the entire area of the wafer. This is because a number of parameters related to each unit process cannot be accurately controlled. For this reason, it can be said that there always exist process errors due to unexpected or inaccurately controlled process parameters.

For example, in the formation of a gate electrode, a critical dimension (CD), which represents the width of the gate electrode, may be irregular per a specific position on a wafer. Generally, the CD of the gate electrode may be larger at the center of the wafer than that at the edge of the wafer, or vice versa. As stated above, such a difference in the CD is because of a difficulty to accurately control a number of parameters related to the several unit processes. Where the CD of the gate electrode is larger at the center of the wafer than that at the edge of the wafer, a threshold voltage of a resulting device must be larger at the center of the wafer than that at the edge of the wafer. Conversely, where the CD of the gate electrode is larger at the edge of the wafer than that at the center of the wafer, a threshold voltage of a resulting device must be smaller at the center of the wafer than that at the edge of the wafer. The difference in the CD of the gate electrode depending on positions on the wafer may cause a serious problem that is proportional to the degree of integration of devices.

SUMMARY OF THE INVENTION

The embodiments of the present invention provide a partial ion implantation apparatus using a bundled beam (or concentrated beam), which is capable of implanting different doses of ions per different regions of a wafer.

The embodiments provide a partial ion implantation method for implanting different doses of ions per different regions of a wafer.

In accordance with one aspect of the present invention, a partial ion implantation apparatus comprises an ion beam source for generating an initial ion beam; a bundled ion beam generator adapted to change the initial ion beam into a bundled ion beam based on a predetermined frequency to thereby pass the bundled ion beam for a first time while passing the initial ion beam unchanged for a second time; a beam line for accelerating the ion beam having passed through the ion beam generator; and an end station for arranging a wafer therein to allow the ion beam, which was accelerated by the beam line, to be implanted in the wafer, the end station operating to move the wafer in a direction perpendicular to an ion beam implantation direction, so as to implant the bundled ion beam in a first region of the wafer and the initial ion beam in a second region of the wafer.

Preferably, the bundled ion beam generator may include: an electrode arranged on the path of the initial ion beam generated from the ion beam source; and a resonator adapted to be turned on for the first time so as to sequentially apply a positive bias and negative bias to the electrode, and to be turned off for the second time so as to apply no bias to the electrode.

Preferably, the resonator may be an RLC resonator.

Preferably, the first and second times may be determined by regulating a capacitance value of the RLC resonator.

Preferably, the end station may contain a wafer supporting die for rotating the wafer while the bundled ion beam or initial ion beam is implanted in the wafer.

In accordance with another aspect of the present invention, the above and other objects can be accomplished by the provision of a partial ion implantation apparatus comprising: an ion beam source for generating an initial ion beam; a beam line for accelerating the initial ion beam; a bundled ion beam generator adapted to change the accelerated initial ion beam into a bundled ion beam based on a predetermined frequency to thereby pass the bundled ion beam for a first time while passing the initial ion beam unchanged for a second time;and an end station for arranging a wafer therein to allow the bundled ion beam or initial ion beam, having passed through the bundled ion beam generator, to be implanted in the wafer, the end station operating to move the wafer in a direction perpendicular to an ion beam implantation direction, so as to implant the bundled ion beam in a first region of the wafer and the initial ion beam in a second region of the wafer.

Preferably, the bundled ion beam generator may include: an electrode arranged on the path of the initial ion beam accelerated by the beam line; and a resonator adapted to be turned on for the first time so as to sequentially apply a positive bias and negative bias to the electrode, and to be turned off for the second time so as to apply no bias to the electrode.

Preferably, the end station may contain a wafer supporting die for rotating the wafer while the bundled ion beam or initial ion beam is implanted in the wafer.

In accordance with a further aspect of the present invention, the above and other objects can be accomplished by the provision of a partial ion implantation apparatus comprising: an ion beam source for generating an initial ion beam; a beam line for accelerating the initial ion beam, the beam line containing a bundled ion beam generator adapted to change the accelerated initial ion beam into a bundled ion beam based on a predetermined frequency to pass the bundled ion beam for a first time while passing the initial ion beam unchanged for a second time; and an end station for arranging a wafer therein to allow the bundled ion beam or initial ion beam, having passed through the beam line, to be implanted in the wafer, the end station operating to move the wafer in a direction perpendicular to an ion beam implantation direction, so as to implant the bundled ion beam in a first region of the wafer and the initial ion beam in a second region of the wafer.

Preferably, the bundled ion beam generator may include: an electrode arranged on the path of the initial ion beam accelerated in the beam line; and a resonator adapted to be turned on for the first time so as to sequentially apply a positive bias and negative bias to the electrode, and to be turned off for the second time so as to apply no bias to the electrode.

Preferably, the end station may contain a wafer supporting die for rotating the wafer while the bundled ion beam or initial ion beam is implanted in the wafer.

In accordance with yet another aspect of the present invention, the above and other objects can be accomplished by the provision of a partial ion implantation method comprising the steps of: changing an initial ion beam into a bundled ion beam based on a predetermined frequency to pass the bundled ion beam for a first time while passing the initial ion beam unchanged for a second time; and moving a wafer in a direction perpendicular to the path of the ion beam while the bundled ion beam or initial ion beam is implanted in the wafer, so as to implant the bundled ion beam in a first region of the wafer and the initial ion beam in a second region of the wafer.

Preferably, the method may further comprise the step of: rotating the wafer while moving the wafer in the direction perpendicular to the path of the ion beam.

Preferably, the passing of the bundled ion beam or initial ion beam may include the sub steps of: sequentially applying a positive bias and negative bias to an electrode, which is arranged on the path of the initial ion beam, to pass the bundled ion beam obtained from the initial ion beam; and applying no bias to the electrode, to pass the initial ion beam unchanged.

Preferably, a relatively higher dose of ions may be implanted in the first region of the wafer, and a relatively lower dose of ions may be implanted in the second region of the wafer.

DESCRIPTION OF THE PREFERRED EMBODIMENTS

Figure 1:
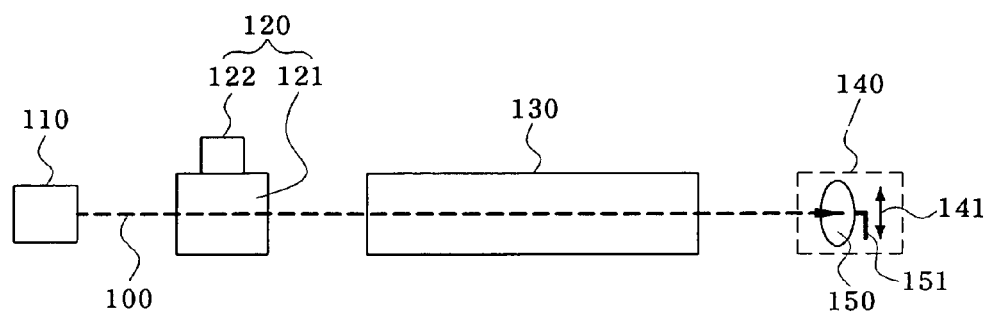
FIG. 1 is a view illustrating a partial ion implantation apparatus according to one embodiment of the present invention.

FIG. 1 is a view illustrating a partial ion implantation apparatus according to one embodiment of the present invention.

Referring to FIG. 1, the partial ion implantation apparatus of the present embodiment comprises an ion beam source 110, a bundled ion beam generator 120, a beam line 130, and an end station 140. The ion beam source 110 serves to generate an initial ion beam 100. The bundled ion beam generator 120 includes an electrode 121 arranged on the path of the initial ion beam 100, and a resonator 122 adapted to turn on or off the electrode 121. While the electrode 121 is turned off by the resonator 122, the initial ion beam 100 passes unchanged through the bundled ion beam generator 120. On the other hand, while the electrode 121 is turned on by the resonator 122, the initial ion beam 100 is bundled to generate a bundled ion beam via a resonance operation of the resonator 122. The bundled ion beam, consequently, passes through the bundled ion beam generator 120. The beam line 130 serves to accelerate the initial ion beam or the bundled ion beam having passed through the bundled ion beam generator. The end station 140 is a place where a wafer 150 is disposed during a partial ion implantation process. The end station 140 contains a wafer supporting die (or wafer support) 151 for supporting the wafer 150 thereon. The wafer supporting die is movable to move the wafer 150 in a direction as designated by the arrow 141 of FIG. 1 perpendicular to an ion beam implantation direction. The movement speed of the wafer 150 depends on the operation of the bundled ion beam generator 120. Specifically, the movement speed of the wafer 150 is appropriately regulated such that the bundled ion beam is implanted into a first region of the wafer 150, whereas the initial ion beam 100 is implanted into a second region of the wafer 150.

Figure 2:
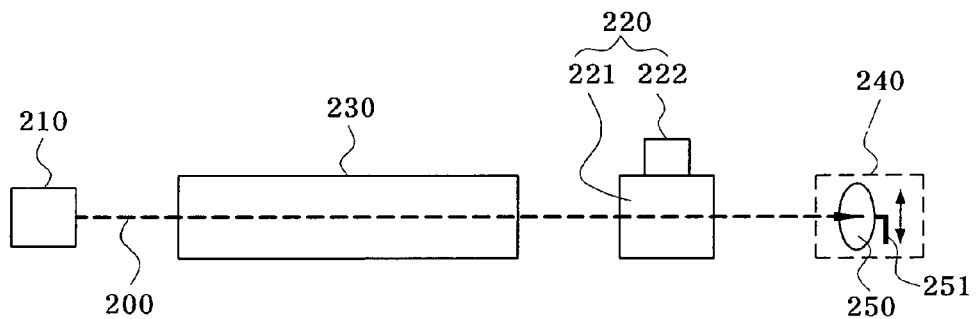
FIG. 2 is a view illustrating a partial ion implantation apparatus according to another embodiment of the present invention.

FIG. 2 is a view illustrating a partial ion implantation apparatus according to another embodiment of the present invention.

Referring to FIG. 2, the partial ion implantation apparatus of the present embodiment is different from that of the previously described embodiment in view of the fact that a bundled ion beam generator 220 is located between a beam line 230 and an end station 240. In the present embodiment, if an initial ion beam 200 is generated from an ion beam source 210, it is first accelerated while passing through the beam line 230. Then, the accelerated initial ion beam 200, having passed through the beam line 230, passes through the bundled ion beam generator 220 without change, or after being changed into a bundled ion beam. The bundled ion beam generator 220 includes an electrode 221 arranged on the path of the initial ion beam, and a resonator 222 adapted to turn on or off the electrode 221. After passing through the bundled ion beam generator 220, the initial ion beam or bundled ion beam is implanted into a wafer 250 disposed in the end station 240. The wafer 250 is moved in a direction perpendicular to an ion beam implantation direction. Similar to the previously described embodiment, the movement speed of the wafer 250 depends on the operation of the bundled ion beam generator 220. Thus, the movement speed of the wafer 250 is able to be appropriately regulated such that the bundled ion beam is implanted into a first region of the wafer 250, whereas the initial ion beam 100 is implanted into a second region of the wafer 250.

Although not shown in the drawings, according to yet another embodiment of the present invention, the bundled ion beam generator (see reference numeral 120 of FIG. 1 or reference numeral 220 of FIG. 2) may be disposed in the beam line (see. reference numeral 130 of FIG. 1 or reference numeral 230 of FIG. 2). In this case, the operation of the partial ion implantation apparatus corresponds to that explained with reference to FIGS. 1 and 2. One difference is that the bundled ion beam is generated inside the beam line.

Figure 3:
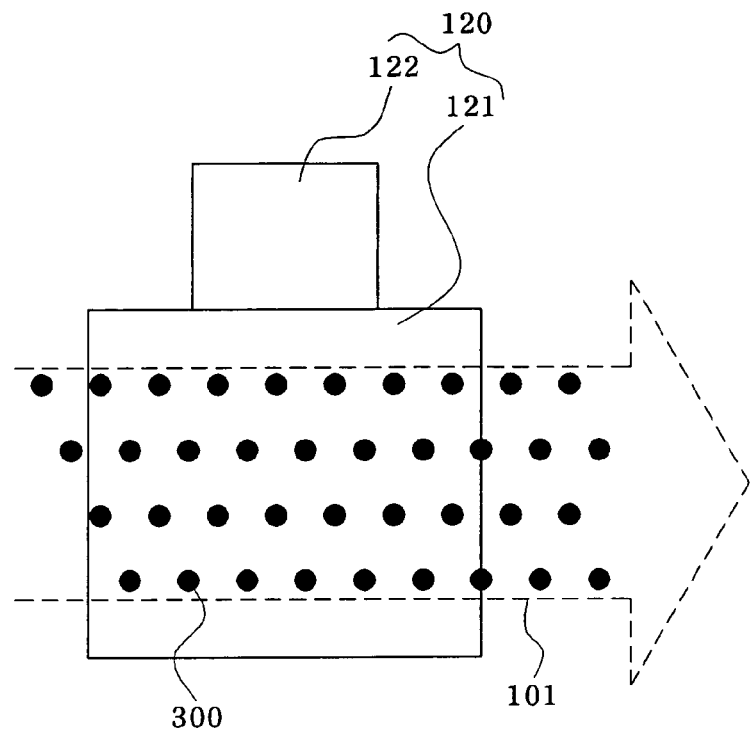
FIGS. 3 and 4 are views illustrating the operation of a bundled ion beam generator of FIGS. 1 and 2.
Figure 4:
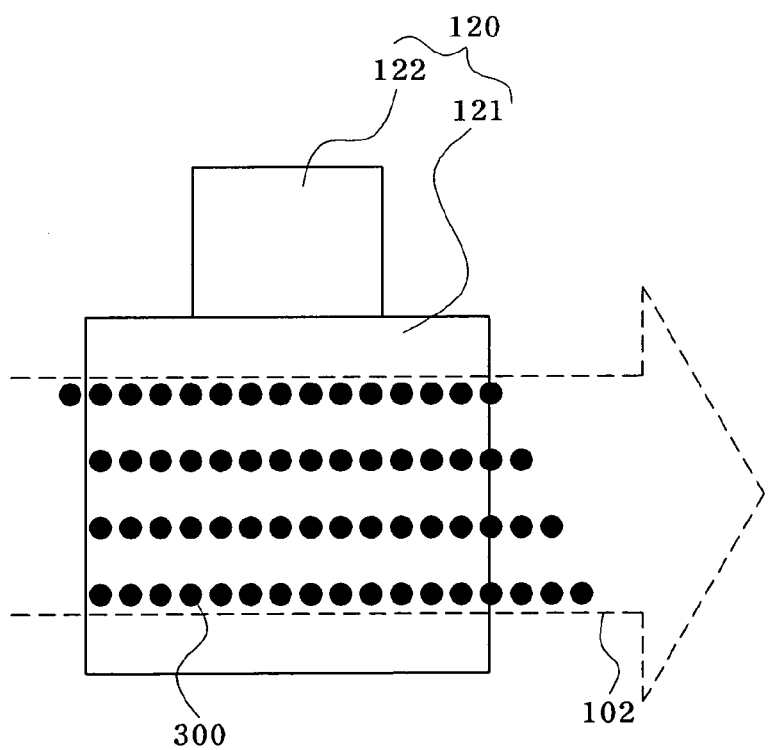

FIGS. 3 and 4 are views illustrating the operation of the bundled ion beam generator of FIGS. 1 and 2.

Referring first to FIG. 3, in a state wherein the electrode 121 is turned off by the resonator 122, an initial ion beam 101 passes unchanged through the bundled ion beam generator 120. The initial ion beam 101 is an ion beam in which ions 300 are distributed at relatively wide intervals (or relatively sparsely distributed). On the other hand, referring to FIG. 4, in a state wherein the electrode 121 is turned on by the resonator 122, the initial ion beam is changed into a bundled ion beam 102, to pass through the bundle ion beam generator 120 while keeping the form of the bundled ion beam 102. The bundled ion beam 102 is an ion beam in which the ions 300 are distributed at relatively close intervals (or relatively densely distributed).

Figure 5:
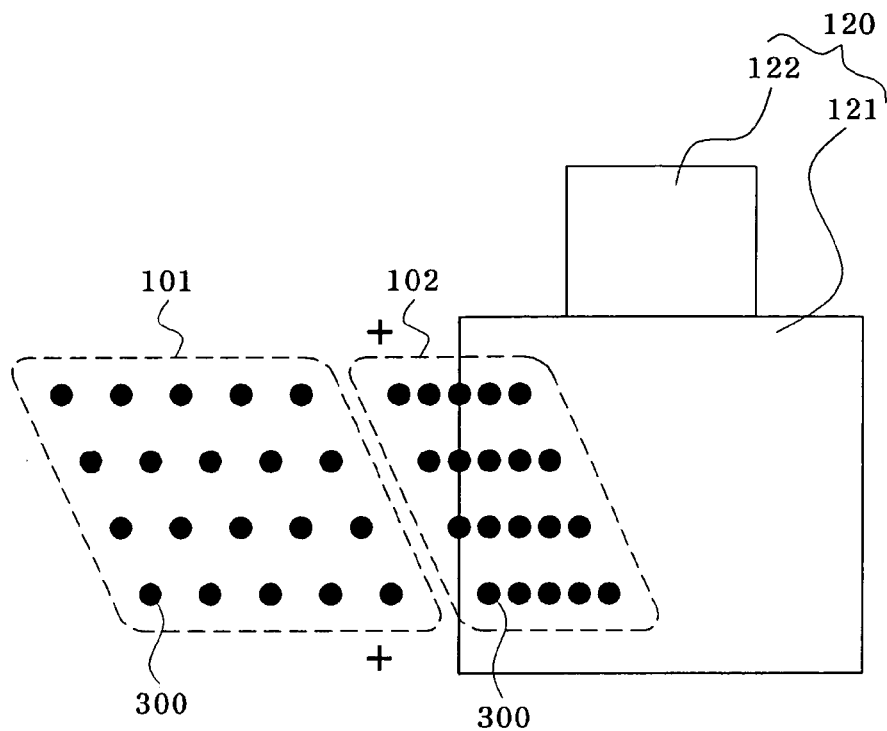
FIGS. 5 and 6 are views illustrating a method for generating a bundled ion beam using an ion beam generator of FIGS. 1 and 2.
Figure 6:
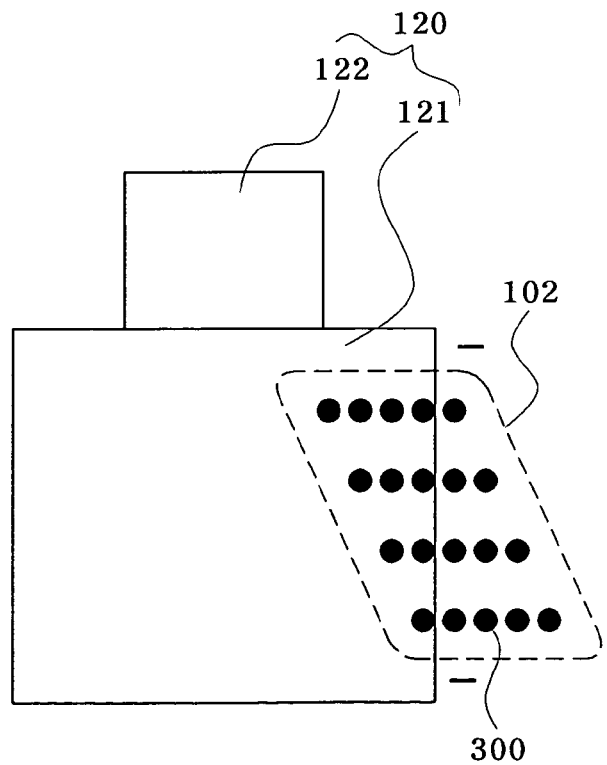

FIGS. 5 and 6 are views illustrating a method for generating the bundled ion beam using the bundled ion beam generator of FIGS. 1 and 2.

Referring first to FIG. 5, when the initial ion beam 101 is incident on the bundled ion beam generator 120, the resonator 122 applies a positive bias to the electrode 121. The resonator 122 may be an RLC resonator. In this case, the resonator 122 is capable of sequentially applying a positive bias and negative bias to the electrode 121 in accordance with a predetermined frequency determined by the capacitance of a capacitor. If the positive bias is applied to the electrode 121, a repulsive force acts between the electrode 121 and the positive ions 300 constituting the incident initial ion beam 101. The repulsive force prevents the initial ion beam 101 from keeping the original state thereof when passing through the electrode 121, thereby causing the ion beams 300 of the initial ion beam 101 to be bundled at a front end of the electrode 121. As a result of bundling of the ions 300, the bundled ion beam 102, in which the ions 300 are distributed at relatively close intervals, is generated.

Next, referring to FIG. 6, after an appropriate density of the bundled ion beam 102 is generated, the resonator 122 is adapted to apply a negative bias to the electrode 121. As previously described above, the negative bias is applied to the electrode 121 via the resonance operation of the resonator 122. If the negative bias is applied to the electrode 121, an attractive force acts between the electrode 121 and the bundled ion beam 102. With the attractive force, the bundled ion beam 102 is drawn to a rear end of the electrode 121, to pass through the bundled ion beam generator 120 while keeping the form of the bundled ion beam 102.

Figure 7:
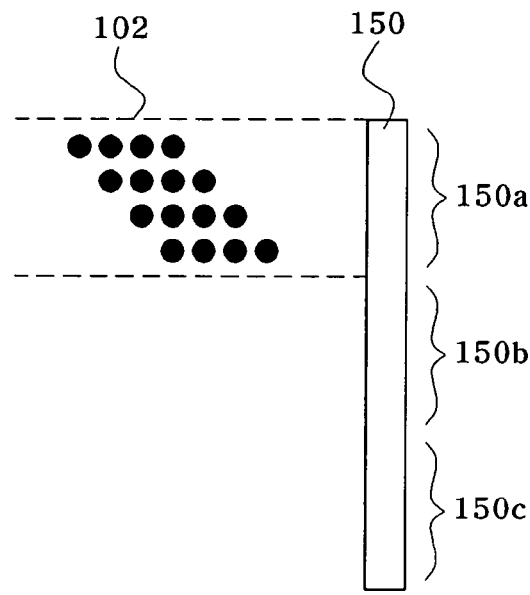
FIGS. 7 to 9 are views illustrating sequential steps of a partial ion implantation method according to the present invention.
Figure 8:
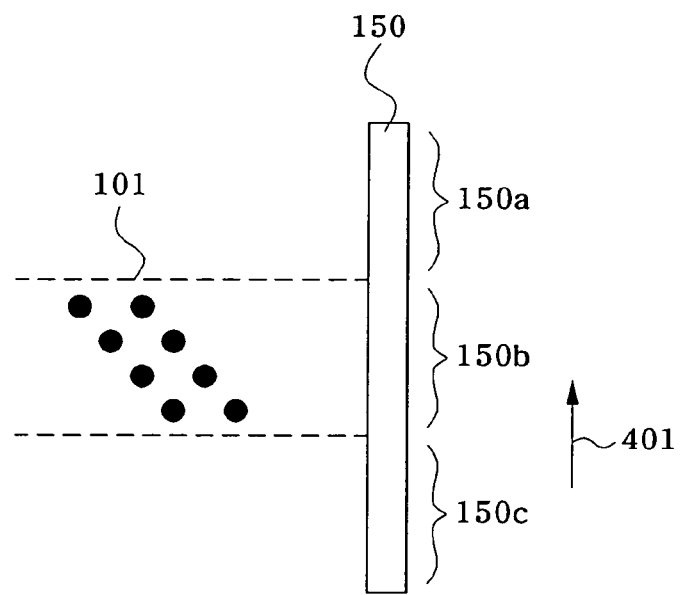
Figure 9:
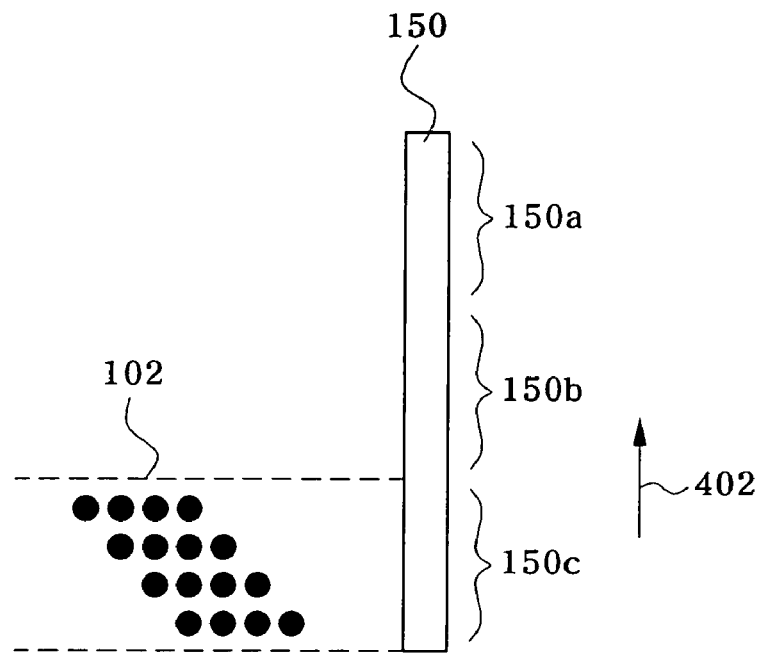

FIGS. 7 to 9 are views illustrating sequential steps of a partial ion implantation method according to the present invention.

First, the partial ion implantation method of the present invention is performed under the assumption that the wafer 150 is divided into a first region 150*a*, a second region 150*b*, and a third region 150*c* as shown in FIG. 7, such that different doses of ions are implanted in the respective regions. In this case, when it is desired to implant a relatively high dose of ions in the first region 150*a* and third region 150*c* of the wafer 150 while implanting a relatively low dose of ions in the second region 150*b*, the bundled ion beam generator (see reference numeral 120 of FIG. 1) generates the bundled ion beam 102 such that the bundled ion beam 102 is implanted in the first region 150*a* of the wafer 150. Then, as shown in FIG. 8, the wafer 150 is moved in a direction (see the arrow 401) perpendicular to the incident path of the ion beam. In this case, the movement speed of the wafer 150 is determined such that a desired region of the wafer 150 is aligned with the incident path of the ion beam at a time point when the bundled ion beam generator 120 emits the initial ion beam 101 without generating the bundled ion beam 102. Specifically, the movement speed of the wafer 150 is appropriately regulated such that the initial ion beam 101, having passed unchanged through the bundled ion beam generator 120, is implanted in the second region 150*b* of the wafer 150. As a result, the initial ion beam 101 is implanted in the second region 150*b* of the wafer 150, thereby allowing a relatively lower dose of ions to be implanted in the second region 150*b* of the wafer 150 as compared to the first region 150*b* in which the bundled ion beam 102 was implanted.

Referring to FIG. 9, if the bundled ion beam 102 is again generated by the bundled ion beam generator 120, the wafer 150 is moved in a direction (see the arrow 402) perpendicular to the incident path of the ion beam, thereby allowing the bundled ion beam 102 to be implanted in the third region 150*c* of the wafer 150.

Figure 10:
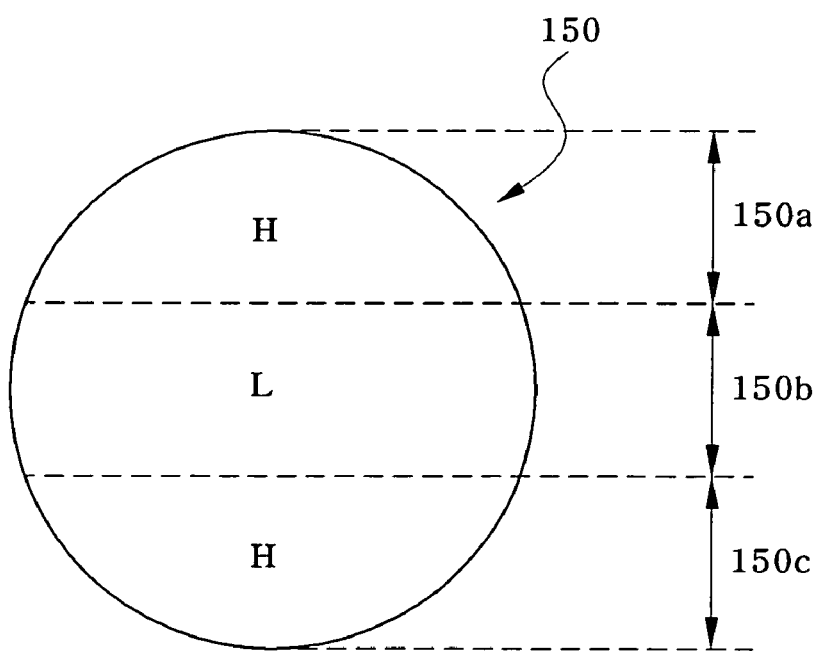
FIGS. 10 and 11 are views illustrating the dose distribution of ions over a wafer obtained via the partial ion implantation method according to the present invention.
Figure 11:
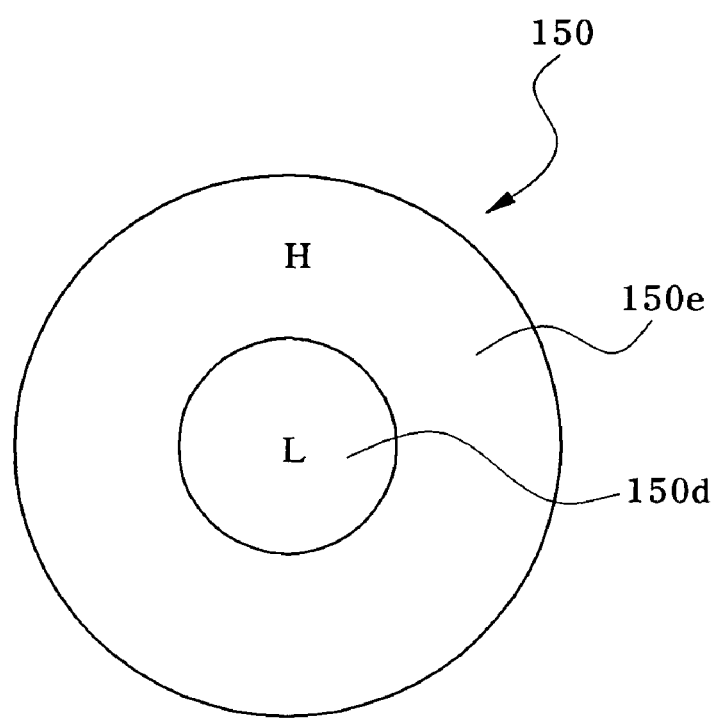

FIGS. 10 and 11 are views depicting the dose distribution of ions over a wafer obtained via the partial ion implantation method according to the present invention.

Referring first to FIG. 10, when the partial ion implantation method using the bundled ion beam is performed as described above with reference to FIGS. 7 to 9, the first and third regions 150*a* and 150*c*, which are upper and lower regions of the wafer 150, have a relatively higher dose H of ions, whereas the second region 150*b*, which is a middle region of the wafer 150, has a relatively lower dose L of ions.

Next, referring to FIG. 11, there is illustrated an alternative partial ion implantation method, which is performed under the assumption that the wafer 150 is divided into a center region 150*d* and a peripheral region 150*e* to implant different doses of ions in the respective regions. In this case, it is necessary to rotate the wafer 150 while performing the partial ion implantation method as described above with reference to FIGS. 7 to 9. Specifically, if the wafer 150 is rotated while the bundled ion beam 102 is implanted in the upper and lower regions of the wafer 150 as shown in FIGS. 7 and 9, a relatively higher dose H of ions is implanted in the peripheral region 150*e* of the wafer 150. On the other hand, if the wafer 150 is rotated while the initial ion beam 101 is implanted in the middle region of the wafer 150 as shown in FIG. 8, a relatively low dose H of ions is implanted in the center region 150*d* of the wafer 150.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. For example, where the wafer is tilted or twisted by a predetermined angle during the implementation of the ion implantation method using the bundled ion beam according to the present invention, a variety of dose distributions can be obtained. Also, if a plurality of bundled ion beam generators is used, a regulation of a difference in the doses of ions is possible.

As apparent from the above description, the present invention provides a partial ion implantation apparatus and method using a bundled beam having the following effects. Firstly, according to the present invention, a bundled ion beam generator is operated in such a fashion that it can generate and pass a bundled ion beam for a predetermined time while passing an initial ion beam unchanged for a predetermined time. Also, the movement of a wafer can be regulated depending on the operation of the bundled ion beam generator. With this configuration, there is an effect in that the bundled ion beam is implanted in a first region of a wafer requiring a relatively higher dose of ions, and the initial ion beam is implanted in a second region of the wafer requiring a relatively lower dose of ions, resulting in an uneven partial ion implantation in the wafer. This has the effect of compensating for a deviation in threshold voltage caused by the following processes, and therefore, providing the entire region of the wafer with uniform threshold voltage properties. Furthermore, the partial ion implantation method of the present invention can be simply performed using only a Y-scan without requiring an X-scan.

What is claimed is:

1. An ion implantation apparatus comprising:
   an ion beam source to generate an initial ion beam;
   a bundled ion beam generator adapted to convert the initial ion beam into a bundled ion beam, the bundled ion beam generator being configured to output the bundled ion beam during a first time period and output the initial ion beam unchanged during a second time period;
   a beam line to accelerate the ion beam; and
   an end station to arrange a wafer therein to enable the ion beam to be implanted in the wafer, the end station configured to move the wafer in a direction perpendicular to an ion beam implantation direction, so as to implant the bundled ion beam in a first region of the wafer and the initial ion beam in a second region of the wafer.

2. The apparatus as set forth in claim 1, wherein the bundled ion beam generator includes:
   an electrode arranged on the path of the initial ion beam generated from the ion beam source; and
   a resonator adapted to be turned on during the first time period so as to sequentially apply a positive bias and negative bias to the electrode, and to be turned off during the second time period so as to apply no bias to the electrode.

3. The apparatus as set forth in claim 2, wherein the resonator is an RLC resonator.

4. The apparatus as set forth in claim 3, wherein the first and second time periods are determined by regulating a capacitance value of the RLC resonator.

5. The apparatus as set forth in claim 1, wherein the end station includes a wafer supporting die to rotate the wafer while the bundled ion beam or initial ion beam is being implanted in the wafer.

6. An ion implantation apparatus comprising:
   an ion beam source to generate an initial ion beam;
   a beam line to accelerate the initial ion beam;
   a bundled ion beam generator adapted to change the accelerated initial ion beam into a bundled ion beam based on a predetermined frequency, the bundled ion beam being configured to output the bundled ion beam during a first time period and the initial ion beam unchanged during a second time period; and
   an end station to provide a wafer at a given location and enable the wafer to be implanted with the bundled ion beam or the initial ion beam output by the bundled ion beam generator, the end station configured to move the wafer in a direction perpendicular to an ion beam implantation direction, so as to receive the bundled ion beam in a first region of the wafer and the initial ion beam in a second region of the wafer.

7. The apparatus as set forth in claim 6, wherein the bundled ion beam generator includes:
   an electrode arranged on the path of the initial ion beam accelerated by the beam line; and
   a resonator adapted to be turned on during the first time period so as to sequentially apply a positive bias and negative bias to the electrode, and to be turned off for the second time period so as to apply no bias to the electrode.

8. The apparatus as set forth in claim 6, wherein the end station contains a wafer supporting die to rotate the wafer while the bundled ion beam or initial ion beam is being implanted in the wafer.

9. An ion implantation apparatus comprising:
   an ion beam source to generate an initial ion beam;
   a beam line to accelerate the initial ion beam, the beam line containing a bundled ion beam generator adapted to convert the accelerated initial ion beam into a bundled ion beam and output the bundled ion beam during a first time period and the initial ion beam during a second time period; and
   an end station to hold a wafer and provide the wafer at a given location to enable the wafer to receive the bundled ion beam or the initial ion beam, the end station configured to move the wafer in a direction perpendicular to an ion beam implantation direction, so as to provide the bundled ion beam to a first region of the wafer and the initial ion beam to a second region of the wafer.

10. The apparatus as set forth in claim 9, wherein the bundled ion beam generator includes:
    an electrode arranged on the path of the initial ion beam accelerated in the beam line; and
    a resonator adapted to be turned on during the first time period so as to sequentially apply a positive bias and negative bias to the electrode, and to be turned off for the second time period so as to apply no bias to the electrode.

11. The apparatus as set forth in claim 9, wherein the end station contains a wafer supporting die to rotate the wafer while the bundled ion beam or initial ion beam is implanted in the wafer.

12. A method for ion implantation, the method comprising:
    converting an initial ion beam received from an ion beam source into a bundled ion beam based on a predetermined frequency;
    outputting the bundled ion beam during a first time period and the initial ion beam during a second time period; and
    moving a wafer in a direction perpendicular to a path of the bundled or initial ion beam while the bundled or initial ion beam is being implanted in the wafer, so as to implant the bundled ion beam in a first region of the wafer and the initial ion beam in a second region of the wafer.

13. The method as set forth in claim 12, further comprising:
    rotating the wafer while moving the wafer in the direction perpendicular to the path of the ion beam.

14. The method as set forth in claim 12, wherein the outputting of the bundled ion beam or initial ion beam includes:
    sequentially applying a positive bias and negative bias to an electrode that is provided on the path of the initial ion beam to output the bundled ion beam by converting the initial ion beam; and
    applying no bias to the electrode to output the initial ion beam during the second time period.

15. The method as set forth in claim 12, wherein a relatively higher dose of ions is implanted in the first region of the wafer, and a relatively lower dose of ions is implanted in the second region of the wafer.

* * * * *